(12) United States Patent
Gachon et al.

(10) Patent No.: US 8,729,982 B2
(45) Date of Patent: May 20, 2014

(54) CROSS-COUPLING FILTER ELEMENTS IN RESONANT STRUCTURES WITH BULK WAVES HAVING MULTIPLE HARMONIC RESONANCES

(75) Inventors: Dorian Gachon, St Cyprien (FR); Sylvain Ballandras, Besancon (FR)

(73) Assignees: Centre National de la Recherche Scientifique (C.N.R.S.), Paris (FR); Universite de Franche-Comte, Besancon (FR)

( * ) Notice: Subject to any disclaimer, the term of this patent is extended or adjusted under 35 U.S.C. 154(b) by 510 days.

(21) Appl. No.: 13/127,920

(22) PCT Filed: Nov. 5, 2009

(86) PCT No.: PCT/FR2009/052138
§ 371 (c)(1),
(2), (4) Date: Jul. 15, 2011

(87) PCT Pub. No.: WO2010/052433
PCT Pub. Date: May 14, 2010

(65) Prior Publication Data
US 2011/0260811 A1    Oct. 27, 2011

(30) Foreign Application Priority Data
Nov. 5, 2008    (FR) ..................... 08 57517

(51) Int. Cl.
 *H03H 9/54*    (2006.01)
 *H03H 9/56*    (2006.01)
 *H03H 9/02*    (2006.01)
(52) U.S. Cl.
 CPC ............... *H03H 9/0207* (2013.01); *H03H 9/54* (2013.01); *H03H 9/56* (2013.01)

USPC ...... 333/189; 333/187; 310/322; 310/323.01; 310/334; 310/357; 310/366

(58) Field of Classification Search
USPC .......... 333/187–189; 310/322, 323, 334, 366, 310/357, 323.01; 29/25.35, 594
See application file for complete search history.

(56) References Cited

U.S. PATENT DOCUMENTS 5,233,259 A * 8/1993 Krishnaswamy et al. .... 310/324
7,609,132 B2 * 10/2009 Ballandras et al. ........... 333/187

(Continued)

FOREIGN PATENT DOCUMENTS

DE    103 19 554 A1    11/2004

OTHER PUBLICATIONS

J. Masson et al.; "High Overtone Bulk Acoustic Resonators Built Using Aluminum Nitride Thin Films Deposited Onto AT-Cut Quartz Plates"; 2006 IEEE International Frequency Control Symposium and Exposition, Jun. 4-7, 2006, pp. 835-838.*

(Continued)

*Primary Examiner* — Barbara Summons
(74) *Attorney, Agent, or Firm* — Young & Thompson

(57) ABSTRACT

The elementary filter of the HBAR type includes two resonators (20, 22) of the HBAR type which are each formed by a transducer (8) and a substrate (12) which are coupled in a suitable manner by electroacoustic waves. The first resonator (20), the second resonator (22) and the coupling element (28) by way of evanescent waves include the same monobloc acoustic substrate (12) which is arranged facing and coupled to the piezoelectric transducer (8) by waves having the same longitudinal or transverse vibration mode through the same reference electrode (10).

14 Claims, 11 Drawing Sheets

(56) References Cited

U.S. PATENT DOCUMENTS

Figure 1:
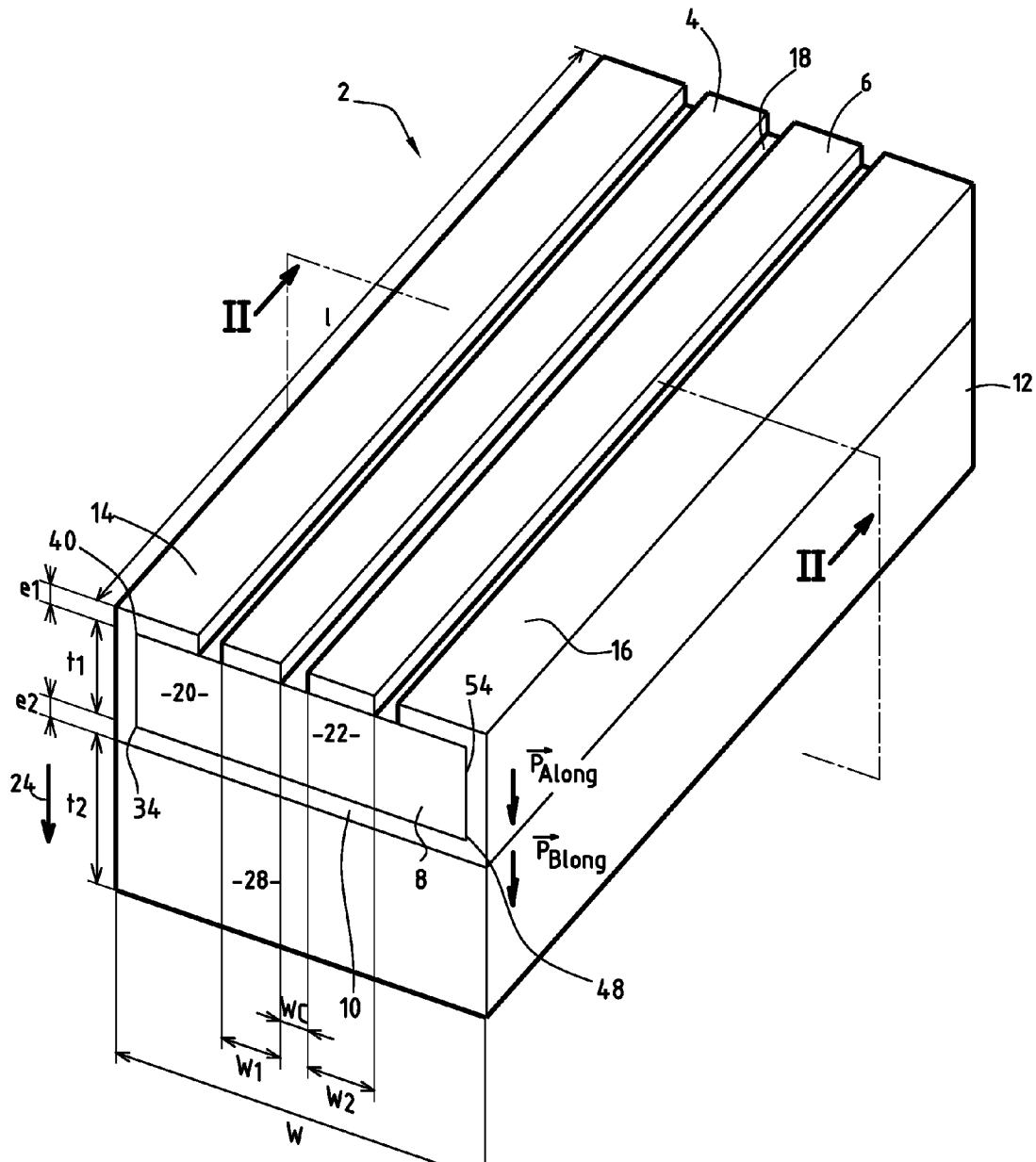

| | | | |
|---|---|---|---|
| 2005/0012570 A1 | 1/2005 | Korden et al. | |
| 2007/0040473 A1* | 2/2007 | Ballandras et al. | 310/320 |
| 2008/0079516 A1* | 4/2008 | Ruby et al. | 333/189 |
| 2010/0052470 A1* | 3/2010 | Andle et al. | 310/313 A |
| 2011/0210802 A1* | 9/2011 | Ballandras et al. | 331/158 |
| 2011/0279187 A1* | 11/2011 | Ballandras et al. | 331/154 |

OTHER PUBLICATIONS

S-Y. Pao et al.; "Analysis and Experiment of HBAR Frequency Spectra and Applications to Characterize the Piezoelectric Thin Film and to HBAR Design"; 2002 IEEE International Frequency Control Symposium and PDA Exhibition, 2002, pp. 27-35.*

D. Gachon et al.; "LiNbO3—LiNbO3 High Overtone Bulk Acoustic Resonator Exhibiting High Q.f Product"; 2007 IEEE Ultrasonics Symposium, Oct. 28-31, 2007, pp. 1417-1420.*

M. Pijolat et al.; "Mode Conversion in High Overtone Bulk Acoustic Wave Resonators"; 2009 IEEE International Frequency Control Symposium Joint with the 22nd European Frequency and Time Forum, Apr. 20-24, 2009, pp. 290-294.*

T. Yanagitani et al.; "Pure-Shear Mode BAW Resonator Consisting of (1120) Textured AlN Films"; 2008 IEEE International Ultrasonics Symposium Proceedings, Nov. 2-5, 2008, pp. 90-93.*

Gachon et al.: "Frequency Sources and Filters Applications Using High Overtone Bulk Acoustic Resonators Exhibiting High Q. f Product", Frequency Control Symposium, 2008 IEEE International, IEEE, Piscataway, NJ, USA, May 19, 2008, pp. 783-788, XP031319975, ISBN: 978-1-4244-1794-0 abstract p. 1, line 1, paragraph II—line 2 sentence 1, paragraph V-paragraph 3 figure 9.

Pijolat et al.: "Large Qxf Product for HBAR using Smart Cut TM transfer of LiNbO3 thin layers onto LiNbO3 substrate", Ultrasonics Symposium, 2008. IUS 2008. IEEE, Nov. 3, 2008, XP002534288 DOI: 10.1109/ULTSYM. 2008.0049 abstract, figures 1, 3, paragraph.

Uno T.: "A Proposal of a Bulk Acoustic Wave Filter Using Piezoelectrically Coupled Resonators", Ultrasonics Symposium, 1994. Proceedings., 1994 IEEE Cannes, France Nov. 1-4, 1994, New York, NY, USA, IEEE, US, vol. 2, Nov. 1, 1994, pp. 945-948, XP010139672, ISBN: 978-0-7803-2012-3, abstract p. 1, right-hand column, line 14-line 20, figures 1, 3.

Lakin K. M. et al.: "High Q Microwave Acoustic Resonators and Filters", Microwave Symposium Digest, 1993., IEEE MIT-S International Atlanta, GA, USA June 14-18, 1993, New Youk, NY, USA, IEE, US, Jun. 14, 1993, pp. 1517-1520, XP010068312, ISBN: 978-0-7803-1209-8, abstract; figure 1a, abstract; figure 1a, p. 2, left-hand column, paragraph 3.

International Search Report, dated Mar. 26, 2010, from corresponding PCT application.

* cited by examiner

CROSS-COUPLING FILTER ELEMENTS IN RESONANT STRUCTURES WITH BULK WAVES HAVING MULTIPLE HARMONIC RESONANCES

The invention relates to an elementary filter of the HBAR type (HBAR/harmonic bulk acoustic resonator) which is intended to form more complex filters and a corresponding production method.

The principle for constructing a filter involving coupling, by means of a narrow intermediate zone, two identical electroacoustic bulk wave resonators, each one being constituted by an electroacoustic transducer sandwiched between two electrodes, is known. The intermediate zone of the transducer is sufficiently narrow for there to be produced an overlap of the evanescent waves of the fields emitted by the two resonators, thereby producing coupling conditions between the resonances of the two resonators. Those coupling conditions allow the transmission of data between input locations and output locations of the structure of the filter in a spectral zone which becomes increasingly large when the modes are coupled, that is to say that the intermediate separation zone between the two resonators is narrow.

This principle has been developed for frequency filters which operate in the frequency range between 1 and 30 MHz using conventional bulk wave resonators, that is to say, using the fundamental mode of a plate of monocrystalline material, typically quartz, or piezoelectric ceramic material, in order to bring about such coupling.

However, the movement towards higher frequencies appears to be complex because of the increasing thinness of the plates in that perspective, resulting in fragile structures which have a thickness of a few tens of μm to a few μm and which are consequently poorly suited to industrial production techniques.

This principle has also been implemented for thin film filters of aluminium nitride (AlN), but the thicknesses of layers themselves constitute a serious problem in that they allow only to a very small degree the existence of lateral modes allowing effective coupling of the energy between two resonators. The document entitled "Simulation, conception et réalisation de filtre à ondes de volume dans des couches piézoélectriques" (Simulation, design and production of a bulk wave filter in piezoelectric layers", thesis for the Université de Franche-Comté, Besançon, France, 2005 by A. Reinhart), showed that it was practically impossible to envisage producing such filters, except by promoting forced coupling which returns the interdigital transducers used for the surface waves.

The technical problem is to increase the intensity of the coupling provided by the lateral modes of the waves generated within elementary filters by two HBAR type resonators which are coupled together and which can operate at high frequencies of up to 20 GHz.

To that end, the invention relates to an elementary filter of the HBAR type which is intended to operate at a predetermined operating frequency and which comprises a first resonator and a second resonator of the HBAR type, respectively, and an element for coupling by means of overlapping of evanescent waves, the first resonator and the second resonator each comprising a first and a second electrical excitation electrode, respectively, which are discrete and separated by a channel, a same reference electrode and a same monobloc piezoelectric transducer, the coupling element comprising an intermediate zone of the transducer that is arranged between the first resonator and the second resonator, the piezoelectric transducer being constituted by a layer of a first thickness of a first material which is orientated in accordance with an angle φ defined by nomenclature (YXw)/φ of the IEEE standard Std-176 (1949 revision), and which is cut in accordance with a first cutting angle θ1 defined by nomenclature (YXl)/θ of the IEEE standard Std-176 (1949 revision), such that the electroacoustic coupling of the waves in accordance with a longitudinal mode or a transverse mode within the material alone is greater than 5% and characterised in that the first resonator, the second resonator and the coupling element comprise the same monobloc acoustic substrate which is arranged facing and coupled to the piezoelectric transducer by waves having the same longitudinal or transverse vibration mode through the reference electrode.

According to specific embodiments, the elementary filter of the HBAR type comprises one or more of the following features:

the acoustic substrate is constituted by a layer of a second thickness of a second material which has a product coefficient of the operating frequency acoustic quality which is at least $5.10^{12}$, and which is orientated in accordance with an angle φ defined by nomenclature (YXw)/φ of the IEEE standard Std-176 (1949 revision) as being equal to zero, cut in accordance with a second cutting angle θ2 defined by nomenclature (YXl)/θ of the IEEE standard Std-176 (1949 revision) and which has at least one polarisation direction $\vec{P}_{B1}$ corresponding to a vibration mode and the relative arrangement of the transducer and the substrate is such that the polarisation direction of the vibration mode of the transducer and the polarisation direction of the at least one vibration mode of the substrate corresponding to the second cutting angle θ2 are aligned;

the ratio of the thickness of the acoustic substrate to the thickness of the transducer is greater than or equal to one;

the angle φ defined by nomenclature (YXw)/φ of the IEEE standard Std-176 (1949 revision) is equal to zero;

the angle φ defined by nomenclature (YXw)/φ of the IEEE standard Std-176 (1949 revision) is different from zero;

the same vibration mode of the waves is longitudinal;

the same vibration mode of the waves is transverse;

the material of the transducer is included in the group of materials constituted by aluminium nitride (AlN), zinc oxide (ZnO), lithium niobate ($LiNbO_3$), lithium tantalate ($LiTaO_3$) and potassium niobate;

the material of the transducer is preferably included in the group of materials constituted by lithium niobate ($LiNbO_3$) and lithium tantalate ($LiTaO_3$);

the material of the acoustic substrate is included in the group of materials constituted by quartz, potassium niobate, gallium orthophosphate ($GaPO_4$), lithium tetraborate ($LiB_4O_7$), langasite ($La_3Ga_5SO_{14}$), langatate and langanite;

the material of the acoustic substrate is quartz;

the common reference electrode is constituted by a thermocompressible metal;

the common reference electrode is constituted by gold or copper or indium; and the common reference electrode is extended laterally by way of two connection elements which extend round the transducer and which each have an end at the same level as the electrical excitation electrodes.

The invention also relates to a production method for an elementary filter of the HBAR type comprising the steps of:

providing a piezoelectric transducer which is constituted by a layer of a first thickness of a first material which is orientated in accordance with an angle φ defined by nomenclature (YXw)/φ of the IEEE standard Std-176 (1949 revision) as being equal to or different from zero, and which is cut in accordance with a first cutting angle θ1 defined by nomenclature (YXl)/θ of the IEEE standard Std-176 (1949 revision) such that the electroacoustic coupling of the waves in accordance with a longitudinal mode or transverse mode within that material alone is greater than 5%, providing an acoustic substrate which is constituted by a layer of a second thickness of a second material which has a coefficient product of the operating frequency acoustic quality which is at least $5.10^{12}$, and which is orientated in accordance with an angle φ defined by nomenclature (YXw)/φ of the IEEE standard Std-176 (1949 revision) as being equal to zero and which is cut in accordance with a second cutting angle θ2 defined by nomenclature (YXl)/θ of the IEEE standard Std-176 (1949 revision) and which has at least one polarisation direction corresponding to a vibration mode from the longitudinal mode and the transverse mode, metal-coating a face of the substrate and a first face of the transducer with a thermocompressible metal, assembling the transducer and the acoustic substrate and arranging them in relation to each other so that the polarisation direction of the vibration mode of the transducer and the polarisation direction of the at least one vibration mode of the substrate corresponding to the second cutting angle θ2 are aligned, bonding by compression the faces of the substrate and the transducer which are metal-coated in the step, characterised in that it comprises a step of metal-coating a first and a second electrical excitation electrode which are separate from each other on a second face of the transducer so as to form two HBAR resonators which are separated from each other by an intermediate coupling zone of the assembly formed by the transducer, the common reference electrode and the acoustic substrate.

According to specific embodiments, the production method for an elementary filter of the HBAR type comprises one or more of the following features:

the step for metal-coating a first and a second electrical excitation electrode comprises a step for metal-coating an integral electrode on the second face of the transducer, followed by a step of cutting a channel in the integral electrode having a predetermined width in order to form the first and the second electrodes which are separated from each other.

Figure 2:
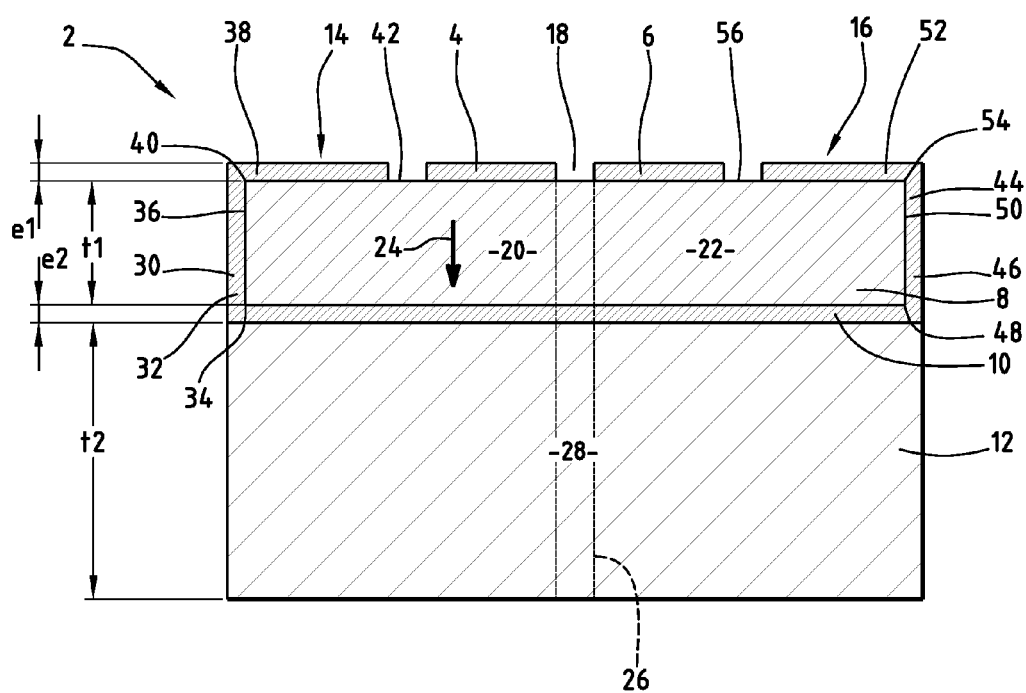
Figure 3:
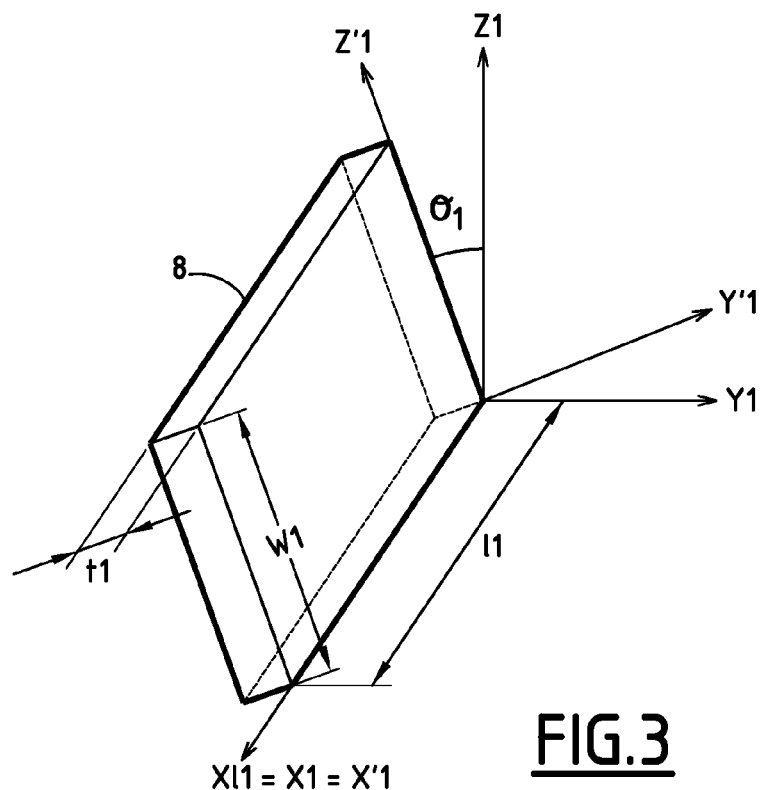
Figure 4:
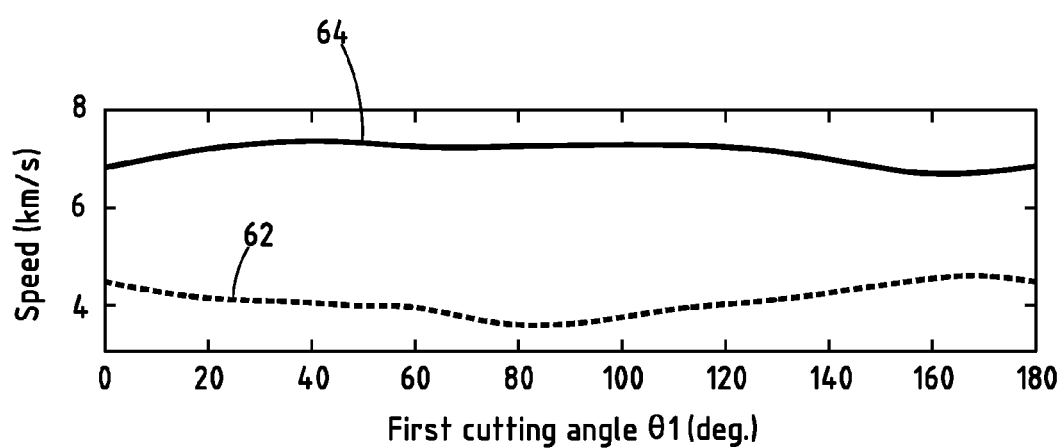
Figure 5:
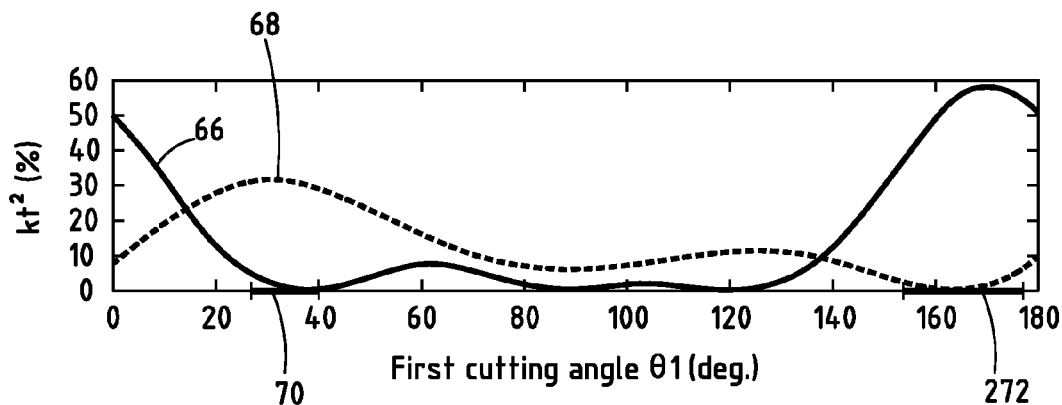
Figure 6:
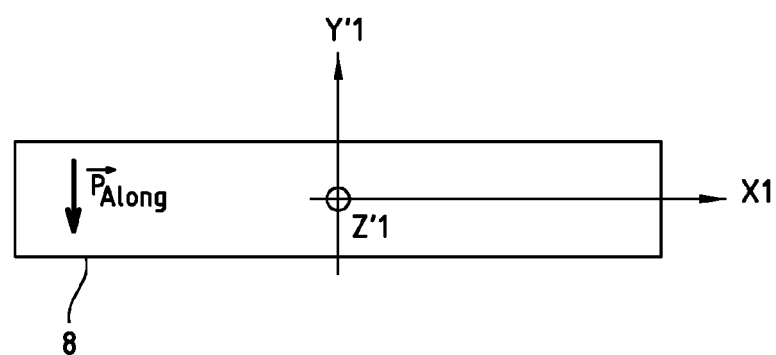
Figure 7:
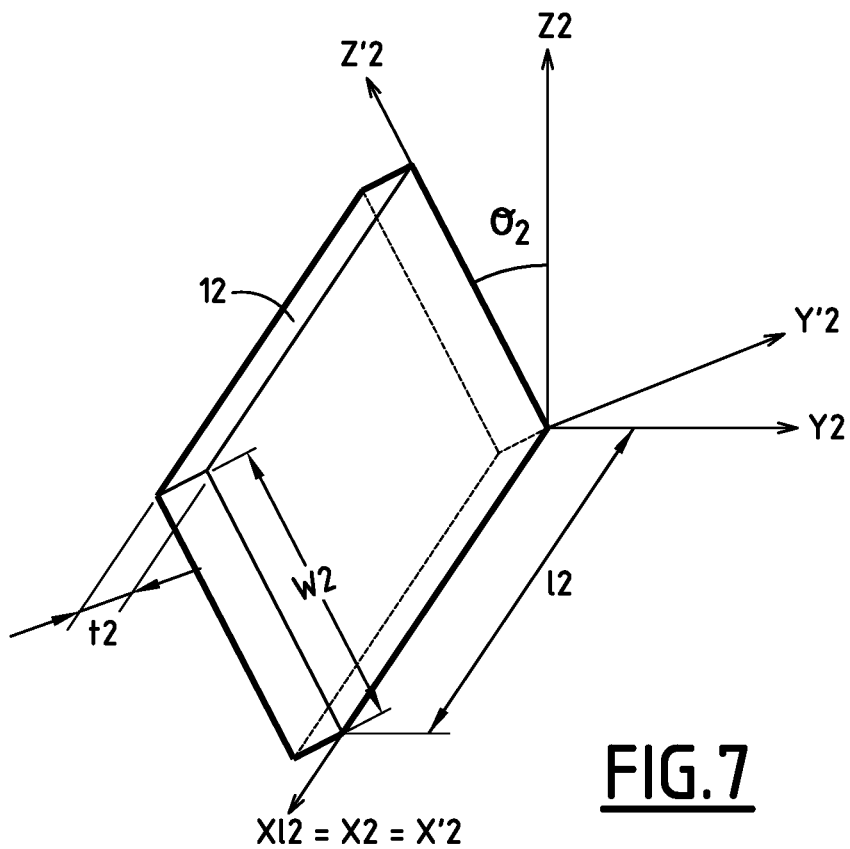
Figure 8:
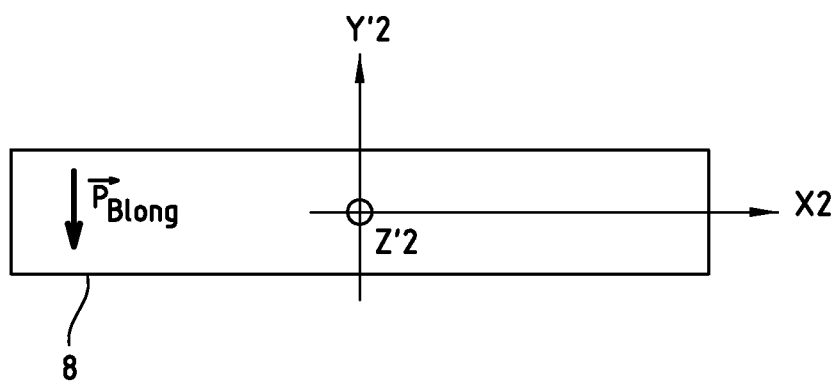
Figure 9:
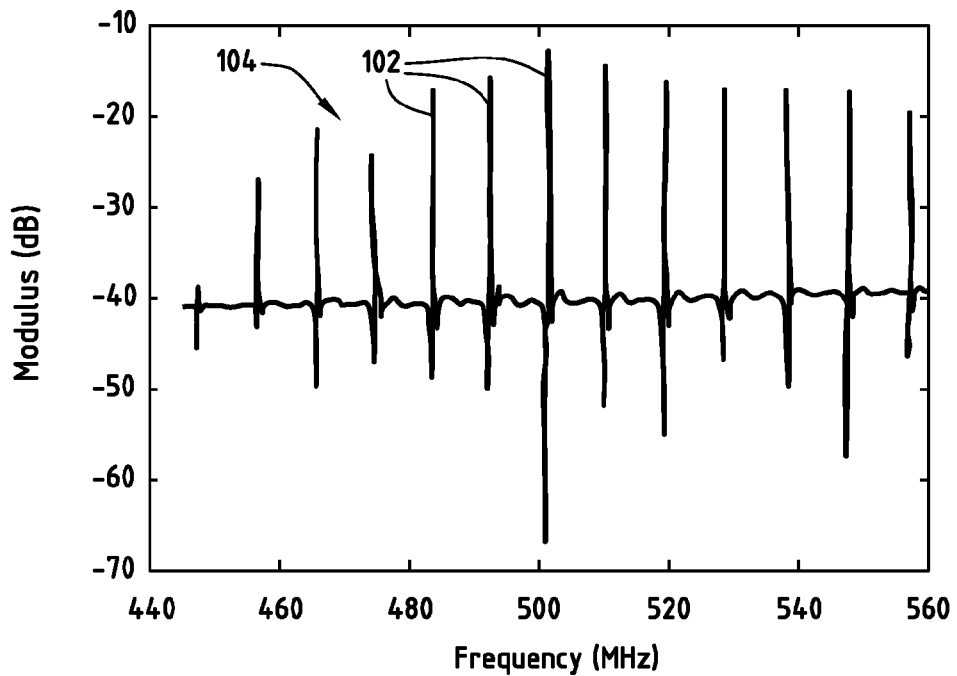
Figure 10:
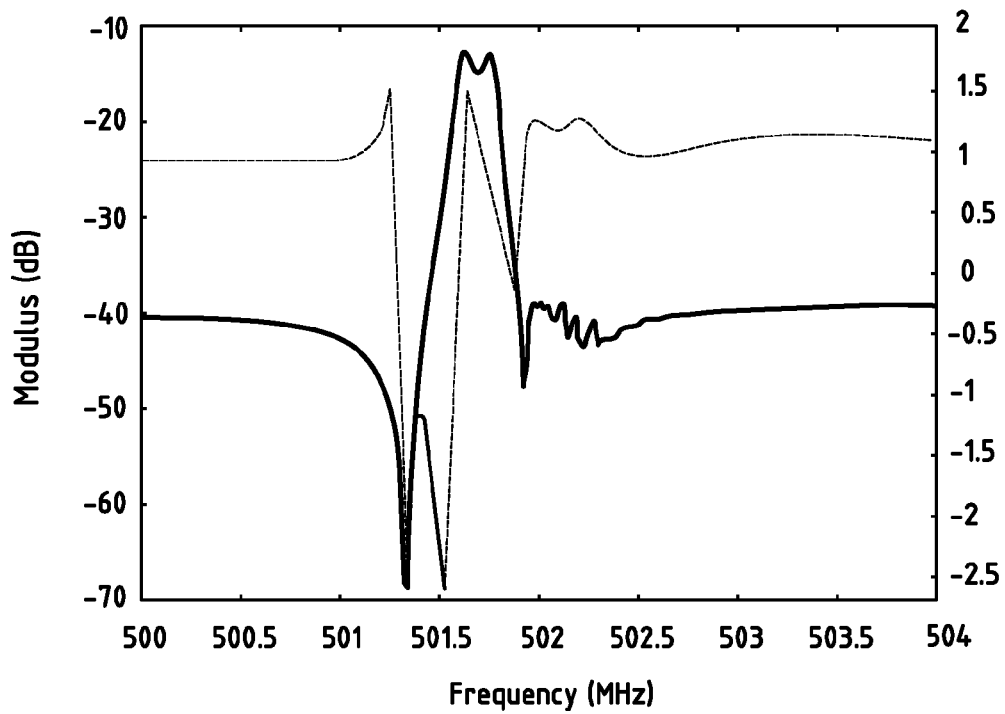
Figure 11:
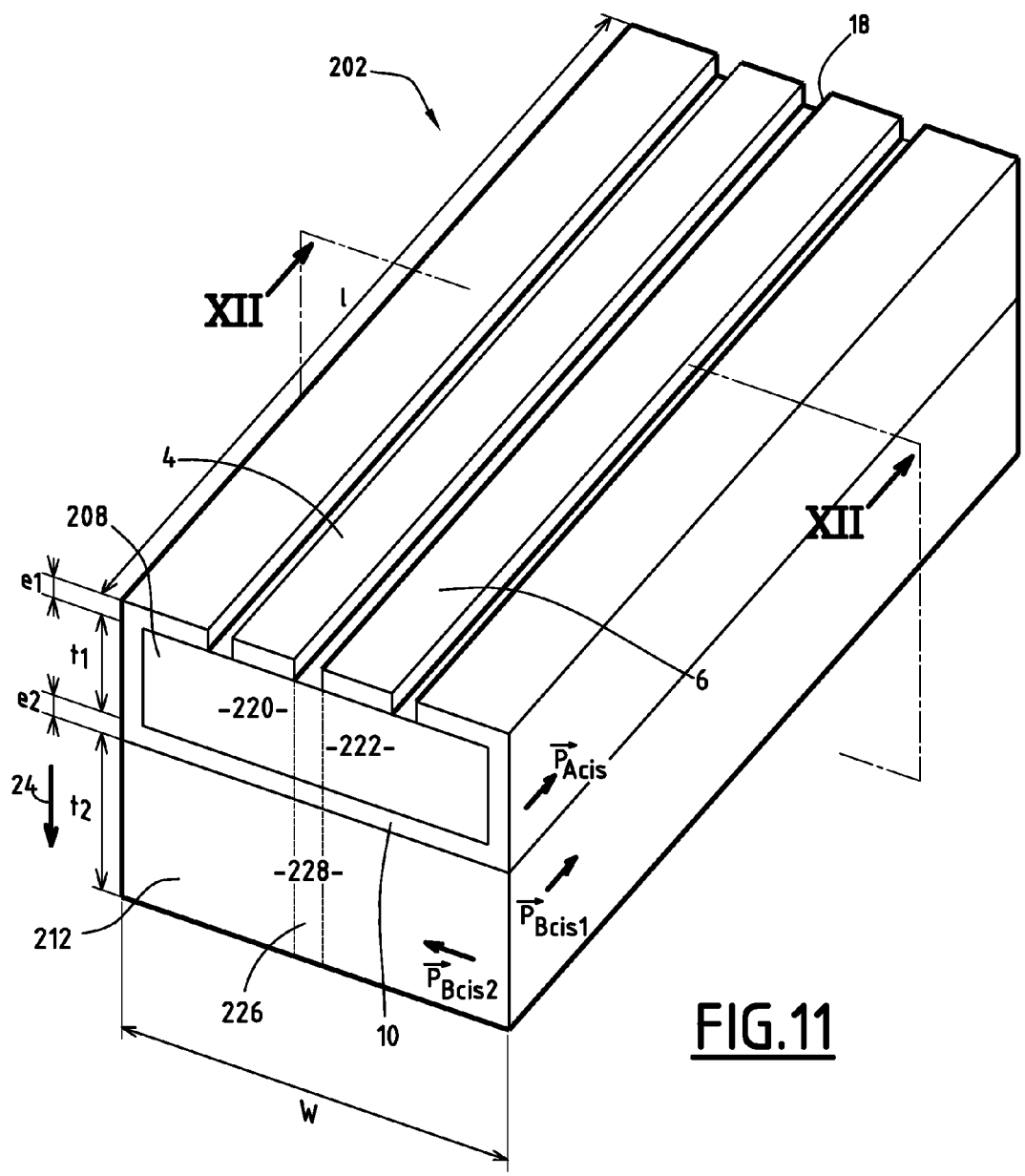
Figure 12:
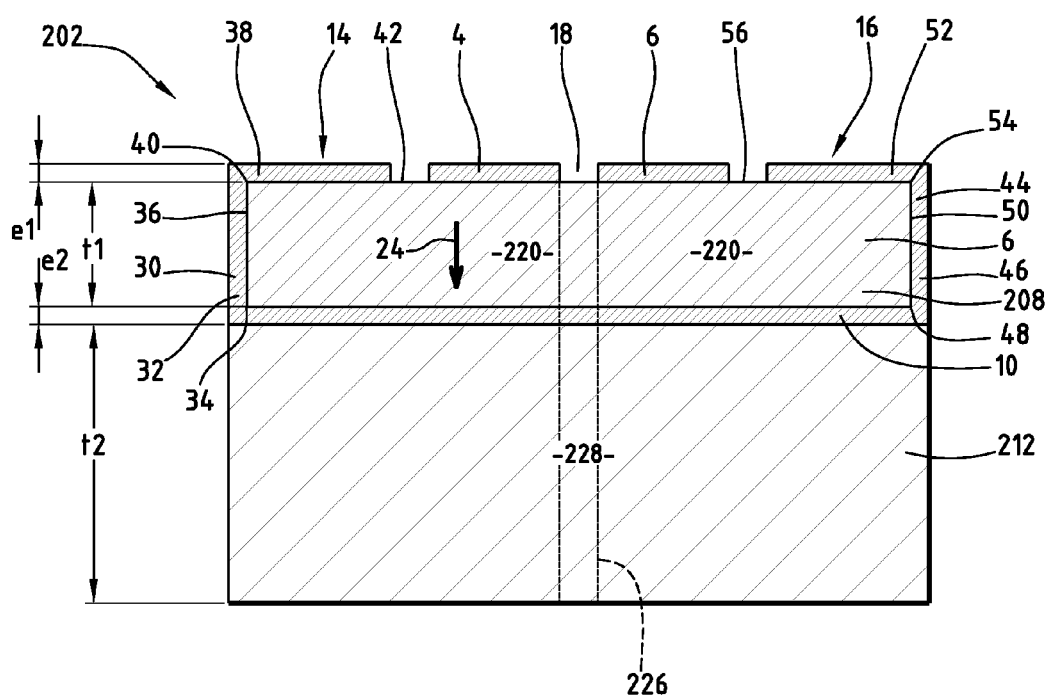
Figure 13:
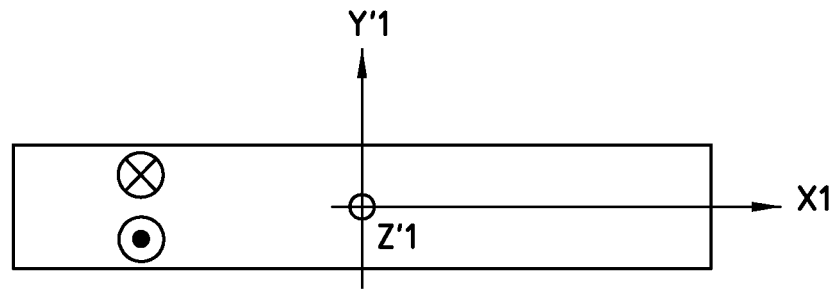
Figure 14:
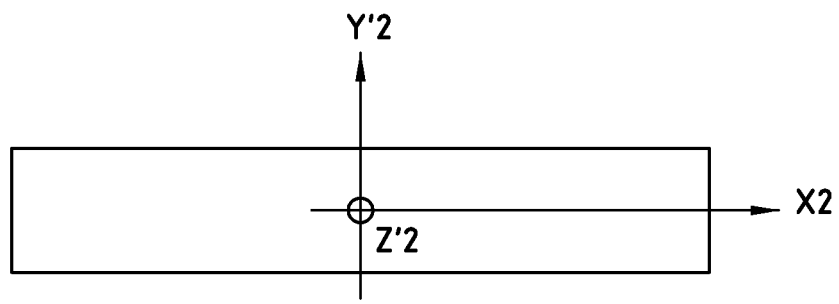
Figure 15:
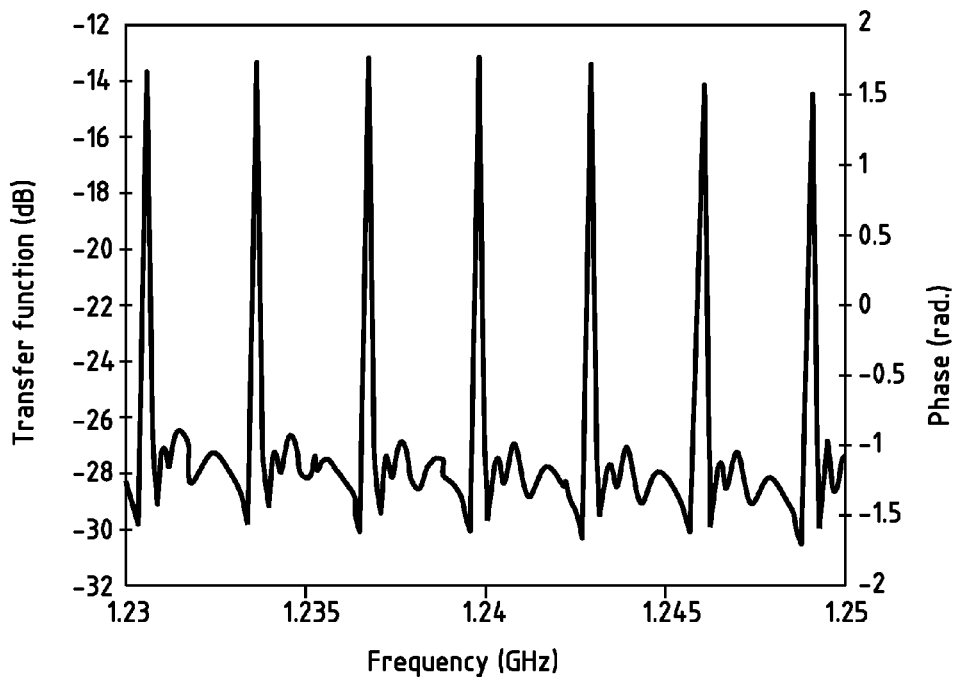
Figure 16:
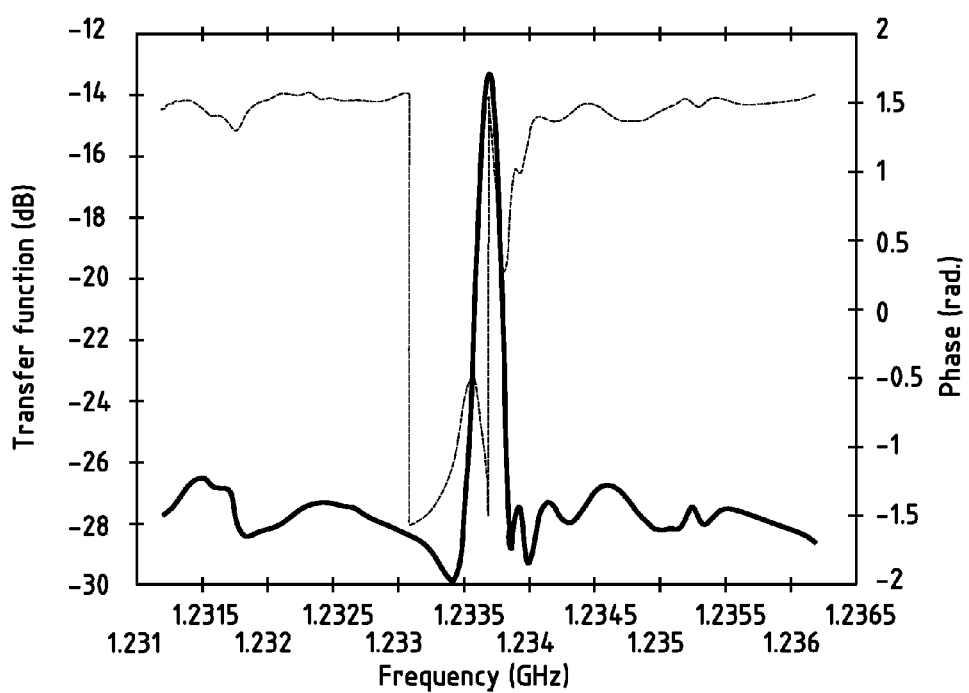
Figure 17:
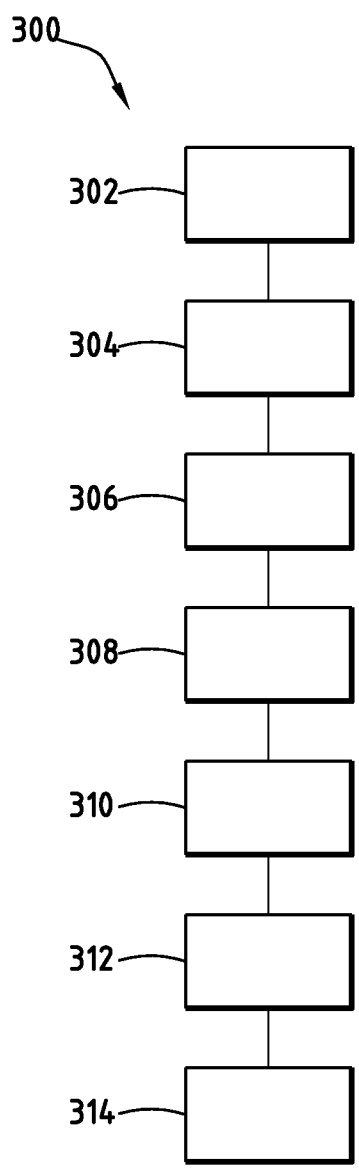

The invention will be better understood from a reading of the description of two embodiments below, given purely by way of example and with reference to the drawings, in which:

FIG. 1 is a perspective view of a first embodiment of an elementary filter of the HBAR type according to the invention, FIG. 2 is a cross-section through the elementary filter of FIG. 1 in accordance with line II-II, FIG. 3 is a representation of the first cutting angle θ1 of the crystal forming the piezoelectric transducer, FIG. 4 is a view of the development of the phase speed of the bulk waves of a crystal of lithium niobate in accordance with the cutting angle θ1, that group of crystalline orientations generally being referred to as "cuts with a single rotation", FIG. 5 is a view of the development of the coupling coefficients of those same waves for lithium niobate in accordance with the angle θ1, FIG. 6 is a planar representation, linked to the plate of the transducer, of the polarisation of the waves corresponding to the first embodiment, FIG. 7 is a representation of the second cutting angle θ2 of the crystal forming the acoustic substrate, FIG. 8 is a planar representation, linked to the plate of the acoustic substrate, of the polarisation of the waves corresponding to the first embodiment, FIG. 9 is a graph of the broad band transfer function of the filter according to the first embodiment, FIG. 10 is an enlarged view of a zone of the graph of FIG. 9, FIG. 11 is a perspective view of a second embodiment of an elementary filter of the HBAR type according to the invention corresponding to coupling of transverse waves, FIG. 12 is a cross-section of the elementary filter of FIG. 11 according to line XII-XII, FIG. 13 is a planar representation, linked to the plate of the transducer, of the polarisation of the waves corresponding to the second embodiment, FIG. 14 is a planar representation, linked to the plate of the acoustic substrate, of the polarisation of the waves corresponding to the second embodiment, FIG. 15 is a graph of the broad band transfer function of the filter according to the second embodiment in the region of 1.24 GHz, FIG. 16 is an enlarged view of a zone of the graph of FIG. 15, FIG. 17 is a flow chart of a method for carrying out production of the elementary filter described in FIGS. 1, 2, 11 and 12.

FIGS. 1 and 2 illustrate a first embodiment of an elementary filter 2 of the HBAR type according to the invention.

The elementary filter 2 comprises a stack of successive layers comprising:

a first upper electrode 4 and a second upper electrode 6 for electrical excitation, which are arranged side by side and which are composed of aluminium having a thickness $e_1$, a monobloc piezoelectric transducer 8 which is constituted by a first material, in this instance lithium niobate ($LiNbO_3$), of monocrystalline form and having a first thickness $t_1$, an integral counter-electrode 10 which forms a reference electrode common to the electrodes 4 and 6 and which in this instance is of parallelepipedal form, composed of gold, embedded and has a thickness $e_2$, a monobloc acoustic substrate 12 which is constituted by a second material, in this instance lithium niobate ($LiNbO_3$), of monocrystalline form and having a second thickness $t_2$.

The filter 2 also comprises a first connection element 14 and a second connection element 16 which are connected to the counter-electrode 10 at the side of the first upper electrode 4 and the second upper electrode 6, respectively.

In FIG. 1, all the layers 4, 6, 8, 10, 12 have the same length l and a width W1, W2, W, W, W, the length l being substantially greater than any one of the widths W1, W2, W and the various layer thicknesses $e_1$, $t_1$, $e_2$ and $t_2$.

In order to simplify FIG. 1, the counter-electrode 10 is illustrated so as to have a surface-area equal to that of the piezoelectric transducer 6.

The whole of the first electrode and second electrode 4, 6 has a surface-area less than that of the embedded counter-electrode 10.

The first and second electrodes 4, 6 are separated, in the direction of the width W1 and W2 thereof, respectively, by a channel 18 having a width WC which is very small in relation to W1 and W2.

The width WC of the channel 18 is also small in relation to the thickness $t_1$ of the transducer 8.

The surfaces of the first upper electrode 4 and the second upper electrode 6, respectively, are arranged facing and parallel with the counter-electrode 10, the facing zones of the surfaces being at a maximum, with edges being arranged as parallel as possible.

In this manner, the excitation of the waves is assumed to correspond to a configuration of a first resonator 20 and a second resonator 22, respectively, which are referred to as being plane-plane, for which the waves are excited by the very thin electrodes 4, 10 and the very thin electrodes 6, 10, respectively, which are deposited on the facing surfaces of the piezoelectric transducer 8, in the direction indicated by the arrow 24 in FIG. 2, for propagating the waves in the transducer 8.

The first resonator 20 comprises the first electrode 4 and the zones of the layers of the same section which are located perpendicularly below, including the corresponding layer of acoustic substrate 12 in this instance.

The second resonator 22 comprises the second electrode 6 and the zones of the same section of the layers located perpendicularly below, including the corresponding layer of acoustic substrate 12 in this instance.

In this manner, the waves of the first and second resonators 20, 22 are coupled by evanescent, transverse waves in an intermediate zone 26 of the filter 2, which zone is roughly delimited by broken lines in the Figure, separating the two resonators 20, 22 and forming a coupling element 28 between the two resonators 20, 22.

The coupling element 28 comprises the portion of transducer 8 located in the intermediate zone 26 immediately below the channel 18 and the portions of the same section of the other layers located in the intermediate zone 26 perpendicularly below the channel 18, including the corresponding layer of acoustic substrate 12.

In this manner, the extent of the coupling zone between the two resonators 20, 22 through the coupling element 28 is increased by the addition of the acoustic substrate 12.

In this instance, the piezoelectric transducer 8 has a longitudinal vibration mode which is excited in accordance with polarisation directed along the thicknesses $e_1$, $t_1$, $e_2$ and $t_2$ of the two resonators 16, 18, represented by the vector $\vec{P}_{Along}$.

The acoustic substrate 12 in this instance has a longitudinal vibration mode $\vec{P}_{Blong}$.

In FIG. 1, the polarisation vector $\vec{P}_{Along}$ of the excitation corresponding to the longitudinal mode of the transducer 8 is aligned with the longitudinal polarisation vector denoted $\vec{P}_{Blong}$ of the acoustic substrate 12.

The counter-electrode 10 interposed between the transducer 8 and the substrate 12 further acts as a bond for the structure of the filter comprising the two resonators 20, 22.

The layer of lithium niobate ($LiNbO_2$) constituting the transducer 8 is a plate which is cut in accordance with a first cutting angle $\theta1$ from a coarse monocrystalline material forming a wafer.

The layer of lithium niobate which constitutes the acoustic substrate 12 is a plate which is cut in accordance with a second cutting angle $\theta2$ from a wafer of the coarse monocrystalline material.

In this instance, the first connection element 14 is a continuation of the counter-electrode 10 which extends at the side of the first upper electrode 4. It is in the form of a strip 30 having a width equal to the length of the counter-electrode 10 and having the same thickness, comprising a first portion 32 which extends round a first lower edge 34 of the transducer 8 and which is pressed against the side 36 of the transducer 8 located at the side of the electrode 4, a second portion 38 extending round a first upper edge 40 of the transducer 8 and being pressed partially against an exposed surface 42 of the transducer 8, opposite the substrate 12 and recessed from the electrode 4. The first connection element 14 thus has an end which is located at the same level as the first upper electrode 4.

In this instance, the second connection element 16 is a continuation of the counter-electrode 10 which extends at the side of the second upper electrode 6. It is in the form of a strip 44 having a width equal to the length of the counter-electrode 10 and having the same thickness, comprising a first portion 46 which extends round a second lower edge 48 of the transducer 8 and which is pressed against the side 50 of the transducer 8 located at the side of the electrode 6, a second portion 52 extending round a second upper edge 54 of the transducer 8 and which is pressed against an exposed surface 56 of the transducer 8 which is recessed from the electrode 6. The second connection element 16 thus has an end located at the same level as the second upper electrode 6.

The elementary filter 2 is capable of being inserted into an electric circuit as a first electric quadripole, of which two inputs are formed by the electrode 4 and the first connection element 14 and two outputs are formed by the electrode 6 and the second connection element 16, the connection elements 14 and 16 being at the same potential.

It may also be considered to be a second electric quadripole having, as the inputs 6, 16 and outputs 4, 14, the function of inverse transfer with respect to that of the first quadripole.

According to FIG. 3, the plate of the transducer 8 is cut in accordance with a first cutting angle $\theta1$ from the material of the wafer which is not illustrated but is indicated by its crystallographic axes $X_1, Y_1, Z_1$, the axis $Z_1$ being the longitudinal axis of the wafer and the crystallographic axes $X_1, Y_1$ being predetermined when the monocrystal is produced.

The angle $\theta1$ is in this instance the one defined in the IEEE standard Std-176 (1949 revision) as being the angle $\theta1$ of a cut with a single rotation about the crystallographic axis X1, the cut being designated $(Y_1\ X_{11})/\theta1$ in the IEEE standard, $X_{11}$ being the axis which is aligned with the lower straight edge having thickness $t_1$ and length 11 in accordance with the illustration of FIG. 3.

The reference connected with the cut plate 8 is illustrated by the three axes $X'_1, Y'_1, Z'_1$, the axis $X'_1$ being aligned with the axis $X_1$. The two axes $Y'_1, Z'_1$ are obtained by the axes $X_1$, $Y_1$ being rotated through angle $\theta1$ about the axis $X_1$, respectively.

FIG. 4 illustrates the development of the phase speed of the longitudinal waves and transverse waves for cuts with a single rotation about the crystallographic axis $X_{II}$ of the transducer 8 when it is constituted by lithium niobate.

The line 62 represents the phase speed of the transverse waves which propagate in the transducer 8 in accordance with the axis which is normal relative to the planes of the electrodes 4, 6 and 10 in accordance with the first cutting angle $\theta1$ expressed in degrees.

The line 64 represents the phase speed of the longitudinal waves, expressed in km/s, which propagate in the transducer in accordance with the axis having the length 1 in accordance with the first angle θ1, expressed in degrees.

FIG. 5 represents the coupling of the longitudinal and transverse waves for the cuts with a single rotation about the crystallographic axis $X_1$ of the transducer 8 when it is constituted by lithium niobate.

The line 66 represents the development of the coupling coefficient $K^2_T$ expressed as a percentage of electrical energy converted into acoustic energy for transverse waves in accordance with the first cutting angle θ1 expressed in degrees.

The line 68 represents the development of the coupling coefficient $K^2_T$ expressed as a percentage of electrical energy converted into acoustic energy for longitudinal waves in accordance with the first cutting angle θ1 expressed in degrees.

It is apparent in FIG. 5 that the lines 66 and 68 have an angular zone 70, in which the transverse wave is practically not coupled by piezoelectricity and consequently is not electrically excited. The excitation of the longitudinal wave is particularly effective, with electromechanical coupling represented by $K^2_T$ of between 20 and 30%.

The angular zone 70 is centred about the angle θ1 which is 36° and has an extent of 10°.

The cutting angle θ1 of the transducer described in FIG. 1 is selected from the zone 70 of FIG. 5 centred about 36°.

When the planar representation provided in FIG. 6 of the plate of the transducer 8 in accordance with the planar axes $X'_1$, $Y'_1$ is considered, it is apparent that the vibration mode excited by piezoelectricity has a scalar polarisation in accordance with the axis $Y'_1$ which is illustrated in the vertical in FIG. 8, that is to say, normal relative to the plane $(X_1, Z'_1)$, but the spatial dependency of which is described by a function of the spatial co-ordinates in accordance with the excitation plane. The polarisation vector $\vec{P}_{Along}$ is colinear with the axis $Y'_1$.

According to FIG. 7, the acoustic substrate plate 12 is cut in accordance with a second cutting angle θ2 from the coarse monocrystal of the wafer which is not illustrated but which is indicated by the crystallographic axes of the quartz $X_2$, $Y_2$, $Z_2$, the axis $Z_2$ being the optical axis C which appears during the growth of a crystal gem.

The angle θ2 is also in this instance the one defined in the IEEE standard Std-176 (1949 revision) as being the angle θ2 of a cut with a single rotation about the crystallographic axis $X_2$, the cut being designated $(Y_2, X_{12})/\theta2$ in the IEEE standard Std-176, $X_{12}$ being the axis which is aligned with the lower straight edge of thickness $t_2$ and length $l_2$ in accordance with the illustration of FIG. 3.

The reference connected with the cut acoustic substrate plate 12 is represented by the three axes $X'_2$, $Y'_2$, $Z'_2$, the axis $X'_2$ being in alignment with the axis $X_2$. The two axes $Y'_2$, $Z'_2$ are obtained by the axes $Y_2$, $Z_2$ being rotated through the angle θ2 about the axis $X_2$, respectively.

When the planar representation in accordance with the axes $X'_2$, $Y'_2$ provided in FIG. 8 of the acoustic substrate plate 12 is considered, being similar to the planar illustration provided for the transducer 8 in FIG. 6, it is possible to describe the polarisation of the longitudinal vibration mode which it is desirable to exploit in the acoustic substrate 12 which has cuts for which the coefficient product of the operating frequency acoustic quality is at least $5.10^{12}$.

The longitudinal vibration mode of the acoustic substrate 12, which is constituted by lithium niobate, also has scalar polarisation and is established in accordance with the axis $Y'_2$ and depends on the local co-ordinates which are linked to the plate in accordance with the excitation plane. For the transducer plates 8 composed of lithium niobate with a single rotation designated (YXl/θ) in accordance with standard notation IEEE, 1949 revision (IEEE standard on piezoelectricity Std 176-1949, Proc. of the IRE, volume 37, pages 1378-1395, 1949), the longitudinal waves selected only become coupled if the alignments of the crystallographic axes of the transducer 8 and the acoustic substrate 12 are selected advantageously. It is necessary to take those polarisations into consideration when the materials of the transducer and the acoustic substrate are assembled in order to allow coupling of the acoustic waves which it is desirable to excite in the acoustic propagation substrate 12, in this instance lithium niobate.

In this instance, the acoustic coupling effect is achieved by aligning the axis $Z'_1$ of the transducer 8 with the axis $Z'_2$ of the acoustic substrate 12 in such a manner that the polarisation $\vec{P}_{Along}$ is identical to those of transverse modes in the acoustic substrate 12 represented by $\vec{P}_{Blong}$.

The response of the filter 2 constructed in accordance with the first embodiment described in FIG. 1 has been characterised by measurements in terms of transfer function for different bands of frequencies corresponding to the spectral zones of strong coupling of the longitudinal mode.

FIG. 9 illustrates typical broad band spectral response in the region of the harmonics of order 5 of the fundamental mode, which is in this instance 100 MHz, of the transducer, that is to say, in the region of 500 MHz. A plurality of filtering functions 102 forming a comb 104 are visible and are separated from each other by approximately 10 MHz. The out-of-band rejection for an elementary filter 2 which is also referred to as a filtering cell is 25 dB in this instance.

The insertion losses of the elementary filter measured are 10 dB in this instance but may be reduced, taking into consideration that the tested filter is not matched with impedance at 50Ω.

FIG. 10 illustrates, in the form of a modulus line as a solid line and a phase line as a broken line, an increase in the filtering transfer function 102 which is centred at the frequency of 501.1 MHz and which is illustrated in FIG. 9.

The increase very clearly shows two separate poles which form the spectral response of the filter, which proves that the filter operates by coupling vibration modes, a symmetrical mode in which the acoustic vibrations are in phase in the two resonators 20, 22 and an anti-symmetrical mode in which the acoustic vibrations are in phase-opposition in the two resonators 20, 22.

FIGS. 11 and 12 illustrate a second embodiment of an elementary filter 202 of the HBAR type according to the invention.

The external geometric structure of the filter is identical to that of the filter of the first embodiment. Elements which are identical in FIGS. 1, 2 and 10, 11 have the same reference numerals.

Only the transducer 208 and the acoustic substrate 212 of the filter 202 differ from the transducer 8 and the acoustic substrate 12 of the filter 2 of FIG. 1.

The monobloc piezoelectric transducer 208 is constituted from lithium niobate ($LiNbO_3$) in monocrystalline form.

The monobloc acoustic substrate 212 is constituted by quartz in monocrystalline form.

In this instance, the excitation of the waves is also supposed to correspond to a configuration of a first resonator 220 and a second resonator 222, respectively, referred to as plane/plane, for which the waves are excited by the very thin electrodes 4, 10 and the electrodes 6, 10, respectively, which are deposited on the facing surfaces of the piezoelectric transducer 208 in the direction indicated by the arrow 24 in accordance with FIG. 11 for propagation of the waves in the transducer 208.

The first resonator 220 comprises the first electrode 4 and the zones of the layers of the same section which are located perpendicularly below, including in this instance the corresponding layer of acoustic substrate 212.

The second resonator 222 comprises the second electrode 6, and the zones of the same section of the layers located perpendicularly below, including in this instance the corresponding layer of acoustic substrate 212.

In this manner, the waves of the first and second resonators 220, 222 are coupled by transverse evanescent waves in an intermediate zone 226 of the filter 2 separating the two resonators 220, 222 and forming a coupling element 228 between the two resonators.

The coupling element 228 comprises the transducer portion 208 that is located in the intermediate zone 226 immediately below the channel 18 and the portions of the same section of the other layers located in the intermediate zone 226 perpendicularly below the channel 18, including the corresponding layer of acoustic substrate 12.

In this manner, the extent of the coupling zone between the two resonators 220, 222 through the coupling element 228 is increased by the addition of the acoustic substrate 212.

The piezoelectric transducer 208 has a transverse mode which is excited in accordance with polarisation which is directed in accordance with the length 1 of the resonator represented by the vector $\vec{P}_{Acis}$.

The acoustic substrate 212 has two transverse modes, a first referred to as being slow and a second referred to as being rapid.

The so-called rapid transverse waves and the so-called slow transverse waves are defined as being transverse waves of orthogonal polarisation, the so-called rapid waves having a phase speed greater than the so-called slow waves.

In FIG. 11, the polarisation vector $\vec{P}_{Acis}$ of the excitation corresponding to the transverse mode of the transducer 208 is aligned with a polarisation vector which is designated $\vec{P}_{Bcis1}$ corresponding to the slow transverse mode of the acoustic substrate.

A polarisation vector corresponding to the excitation of the rapid transverse mode is represented in FIG. 11 by $\dot{P}_{Bcis2}$ which is orthogonal relative to $\dot{P}_{Bcis1}$ and which is contained in an extension plane of the substrate 212.

The counter-electrode 10 interposed between the transducer 208 and the substrate 212 further serves to bond the structure of the resonator 2.

The layer of lithium niobate (LiNbO$_3$) which constitutes the transducer 208 is a plate which is cut in accordance with a first cutting angle θ1 from a coarse monocrystalline material forming a wafer. The cutting angle θ1 is defined in the same reference as that described in FIG. 3.

The layer of quartz which constitutes the acoustic substrate 212 is a plate which is cut in accordance with a second cutting angle θ2 from a coarse monocrystalline quartz wafer.

The cutting angle θ2 is defined in the same reference as that described in FIG. 7.

It is apparent from FIG. 5, which is applicable for cuts with a single rotation of lithium niobate, that the lines 66 and 68 have an angular zone 272, in which the longitudinal wave is practically not coupled by piezoelectricity and consequently is not electrically excited. The excitation of the transverse wave is particularly effective, with electromechanical coupling represented by $K^2_T$ of between 50 and 60%.

The angular zone 272 is centred about the angle θ1 which is 163° and has a magnitude of 10°.

The cutting angle θ1 of the transducer 208 described in FIG. 10 is selected in the zone 272 of FIG. 5 so as to be 163°.

For the cuts of lithium niobate with a single rotation, only the mode corresponding to the rapid transverse wave has electromechanical coupling by means of piezoelectricity. When the planar representation provided in FIG. 13 of the plate of the transducer 208 is considered in accordance with the planar axes $X'_1, Y'_1$, it is evident that the transverse mode excited by piezoelectricity has scalar polarisation in accordance with the axis $Z'_1$ represented from the end in FIG. 13, that is to say, normal to the plane $(X'_1, Y'_1)$, but the spatial dependency of which is described by a function of the spatial co-ordinates in accordance with the excitation plane. The polarisation vector $\vec{P}_{Acis}$ is colinear relative to the axis $Z'_1$.

When the planar representation in accordance with the axes $X'_2, Y'_2$ provided in FIG. 14 of the quartz plate 212 is considered, being similar to the planar representation provided for the transducer 208 in FIG. 13, it is possible to describe the polarisation of the transverse mode which it is desirable to exploit in quartz, for example, which has cuts for which the sensitivities in terms of temperature of the first order are close to zero without changing sign. The shearing of the quartz is also scalar but is produced in accordance with the axis $X'_2$ and is dependent on the local co-ordinates connected with the plate in accordance with the excitation plane. For the plates of lithium niobate or lithium tantalate with a single rotation designated (YXl/θ) in accordance with standard notation IEEE 1949 revision (IEEE standard on piezoelectricity Std-176-1949, Proc. of the IRE, volume 37, pages 1378-1395, 1949), the transverse waves selected therefore have orthogonal polarisations relative to each other and become coupled only if the alignments of the crystallographic axes of the transducer 208 and the acoustic substrate 212 are selected advantageously. It is necessary to take those polarisations into consideration when assembling the materials of the transducer 208 and the acoustic substrate 212 in order to allow coupling of the acoustic waves which it is desirable to excite in the acoustic substrate 212 for propagation, in this instance quartz.

In this instance, that acoustic coupling effect is achieved by aligning the axis $Z'_1$ of the transducer 208 with the axis $X'_2$ of the acoustic substrate 212, or in an equivalent manner by aligning the axis $X'_1$ of the transducer 208 with the axis $Z'_2$ of the acoustic substrate 212 so that the polarisation $\vec{P}_{Acis}$ is identical to those of shearing modes in the acoustic substrate 212 represented by $\dot{P}_{Bcis1}$ allowing compensation of the thermal shift of the phase speed of the corresponding waves.

In the case of quartz, in the region of the cutting angle θ2 of −24°, the two transverse modes, slow and rapid, change their polarisation. The modes remain orthogonal but the rapid shearing mode replaces the slow shearing mode for the cuts of angle θ2 of between −24 and −90°.

This results in the illustration of FIG. 11 corresponding to a cutting angle θ2 of less than −24° and the polarisation of the vector $\vec{P}_{Bcis1}$ corresponding to slow shearing of axis $X_2$.

If the cutting angle θ2 is greater than −24°, the polarisation vectors $\dot{P}_{Bcis1}$ and $\dot{P}_{Bcis2}$ of FIG. 11 are permutated and it is advantageous to rotate the plate of the transducer through 90°, that is to say, the polarisation vector $\vec{P}_{Acis}$ of the excitation wave of the transducer, so as to align the vector $\vec{P}_{Acis}$ with the polarisation vector $\dot{P}_{Bcis1}$ for slow shearing if it is desirable to operate with a constant shearing mode.

In practice, when it is desirable to stabilise the transfer function of the filter 202 in terms of temperature, the cutting angle θ2 is selected within an angular zone, in which the first temperature coefficient of the frequency of the first order for the slow shearing waves is close to zero and gradually approaches zero. That angular zone is centred about +35° and has a range of 22°, thereby ensuring a first temperature coefficient of the frequency of the first order CTFB1 which is less than 20 ppm·K$^{-1}$ in terms of absolute value.

In this manner, the first cutting angle, the angle θ1, of the transducer 208 of FIG. 11 is selected in the zone 272 of FIG. 5 and the second angle θ2 of the acoustic substrate 212 is selected so as to be approximately +35°.

FIG. 15 illustrates the typical broadband spectral response in the region of the harmonic of order 5 of the fundamental mode of the transducer, that is to say, in the region of 1.24 GHz. A plurality of filtering functions which form a comb are visible and are separated from each other by approximately 3 MHz. The out-of-band rejection for an elementary filter which is also referred to as a filtering cell is 16 dB.

In this instance, the insertion losses of the elementary filter measured are 10 dB but may be reduced taking into consideration that the filter tested is not matched with impedance at 50Ω.

FIG. 16 illustrates, in the form of a modulus line as a solid line and a phase line as a broken line, an increase in the filtering transfer function which is centred at the frequency of 1.2337 GHz and which is illustrated in FIG. 15.

The increase very clearly shows two separate poles forming the spectral response of the filter, which proves that the filter operates by coupling vibration modes, a symmetrical mode in which the acoustic vibrations are in phase in the two resonators 220, 222 and an anti-symmetrical mode in which the acoustic vibrations are in phase opposition in the two resonators 220, 222.

FIG. 17 is a flow chart of a production method 300 for a resonator 202 described in FIG. 11.

In a first step 302, there is provided a piezoelectric transducer 208 which is constituted by a layer of a first thickness of a first material which is orientated in accordance with an angle φ defined by nomenclature (YXw)/φ of the IEEE standard Std-176 (1949 revision) as being zero, and which is cut in accordance with a first cutting angle θ1 defined by nomenclature (YXl)/θ of the IEEE standard Std-176 (1949 revision) so that the electroacoustic coupling of the transverse waves is greater than 5%.

The material of the transducer 208 is selected from the group of materials constituted by aluminium nitride (AlN), zinc oxide (ZnO), lithium niobate (LiNbO$_3$), lithium tantalate (LiTaO$_3$) and potassium niobate.

Preferably, a material from lithium niobate (LiNbO$_3$) and lithium tantalate (LiTaO$_3$) will be selected because it is easier to control the production process of a monocrystal of significant thickness.

Lithium niobate and lithium tantalate can be produced as a wafer having a diameter of 4" in accordance with the standards having a thickness of 500 μm and 350 μm.

In a second step 304, there is provided an acoustic substrate 212 which is constituted by a layer of a second thickness of a second material having a product coefficient of operating frequency acoustic quality which is at least $5.10^{12}$, and which is orientated in accordance with an angle φ defined by nomenclature (YXw)/φ of the IEEE standard Std-176 (1949 revision) as being zero, and which is cut in accordance with a second cutting angle θ2 defined by nomenclature (YXl)/θ of the IEEE standard Std-176 (1949 revision), and which has at least one polarisation direction $\vec{P}_{B1}$ corresponding to a vibration mode.

The material of the acoustic substrate is included in the group of materials constituted by quartz and typical isomorphic substitutes, for example, GeO$_2$ and TeO$_2$, gallium orthophosphate (GaPO$_4$) which is also of isomorphic structure, potassium niobate, lithium tetraborate (LiB$_4$O$_7$), langasite (La$_3$Ga$_5$SiO$_{14}$), langatate, langanite and the various variants thereof.

The material of the acoustic substrate is preferably quartz because it has remarkable properties of stability in terms of temperature and is known very well in the field of crystallography.

In a following step 306, one face of the transducer 208 and one face of the acoustic substrate 212 are metal-coated over a thickness of between 100 and 200 nm by a thermo-compressible or cold-compressible metal, for example, gold, copper or indium, in order to bond the two faces and thereby to form a counter-electrode. In practice, and conventionally, an engagement layer typically of chromium or titanium is included in that layer forming the counter-electrode over a height of 10% of the total thickness of the layer forming the counter-electrode.

Gold is a material which is particularly advantageous for this type of bonding, taking into consideration its plastic properties and its mechanical robustness which is sufficient to ensure an acoustic connection between the transducer 208 and the acoustic substrate 212.

In the assembly step 308, the transducer 208 and the acoustic substrate 212 are arranged in such a manner that the polarisation direction $\vec{P}_A$ of the shearing mode of the transducer 208 and the polarisation direction $\vec{P}_{B1}$ of the at least one shearing mode of the substrate 212 corresponding to the second cutting angle θ2 are aligned.

In a following step 310, the bonding is carried out by compression with or without an increase in temperature in accordance with the metal used.

When gold is used, the heating phase is dispensed with and a pressing operation lasting for a long time is carried out, taking advantage of the qualities of the facing surfaces and the ductility of the metal material in order to ensure bonding.

Thus, a plurality of composite panels of lithium niobate/quartz were able to be produced in this manner without any faults, with it being necessary to maintain a temperature of 30° C. for the sixteen hours of application of a pressure of 3000 Newton for wafers which are three inches in diameter.

In a step 312, the panel of the resonator is subsequently ground and polished.

In a step 314, a first electrical excitation electrode 4 and a second electrical excitation electrode 6 which are separate from each other are subsequently metal-coated on one face of the transducer 208 opposite the substrate 212 so as to form two HBAR resonators 220, 222 which are separated from each other by an intermediate zone 226 for coupling the assembly formed by the transducer 208, the common reference electrode 10 and the acoustic substrate 212.

The two separate electrodes 4 and 6 can be metal-coated separately or can be obtained by engraving a primary metal-coated electrode beforehand.

The method is simple to carry out, particularly owing to a wide range of values of the second cutting angle θ2 which allows good effectiveness to be obtained in terms of temperature stability.

The resonators obtained using this method can further operate up to frequencies of 20 GHz. The resonators are light and take up little space, providing a high level of integration.

Such a resonator may, for example, be integrated in a homodyne oscillator or in cells for a high-rejection filter.

Naturally, other applications may be envisaged.

In a variant, the steps 302, 304 and 308 are replaced by similar steps, in which the cutting angles of the transducer 8 and the acoustic substrate 12 and the relative arrangement of the transducer 8 and the acoustic substrate 12 are such that coupling by waves having longitudinal vibration modes is selected.

In a variant, the piezoelectric transducer (8, 208) is constituted by a layer of a first thickness of a first material which is orientated in accordance with an angle φ defined by nomenclature (YXw)/φ of the IEEE standard Std-176 (1949 revision) as being different from zero, and which is cut in accordance with the first cutting angle θ1 defined by nomenclature (YXl)/θ of the IEEE standard Std-176 (1949 revision), so that the electroacoustic coupling of the waves in accordance with a longitudinal mode or a transverse mode within the material alone is greater than 5%.

In that cutting variant referred to as involving double rotation, the excitation level of a mode of the transducer is privileged in relation to the other two possible modes, in the sense that the ratio of the amplitude between the privileged mode and the other possible modes is greater than or equal to 10.

The invention claimed is:

1. Elementary filter of the HBAR type which is intended to operate at a predetermined operating frequency, comprising:
   a first resonator (20, 220) and a second resonator (22, 222) of the HBAR type and a coupling element (28, 228) for electroacoustic coupling by means of overlapping of evanescent waves,
   the first resonator (20, 220) and the second resonator (22, 222) each comprising a first electrical excitation electrode (4) and a first connection element (14) and a second electrical excitation electrode (6) and a second connection element (16), respectively, the first and second electrical excitation electrodes being discrete and separated by a channel (18), a common reference electrode (10) and a common monobloc piezoelectric transducer (8, 208), the first and second connection elements being connected to the common reference electrode (10), and wherein the elementary filter is an electric quadripole,
   the coupling element (28, 228) comprising an intermediate zone (26, 226) of the piezoelectric transducer (8, 208) that is arranged between the first resonator and the second resonator (20, 22; 220, 222),
   the piezoelectric transducer (8, 208) being constituted by a layer of a first thickness of a first material which is orientated in accordance with an angle φ defined by nomenclature (YXw)/φ of the IEEE standard Std-176 (1949 revision), and which is cut in accordance with a first cutting angle θ1 defined by nomenclature (YXl)/θ of the IEEE standard Std-176 (1949 revision), such that the electroacoustic coupling of the waves in accordance with a longitudinal mode or a transverse mode within the first material alone is greater than 5%, and
   wherein the first resonator (20, 220), the second resonator (22, 222) and the coupling element (28, 228) comprise a common monobloc acoustic substrate (12, 212) which is arranged facing and coupled to the piezoelectric transducer (8, 208) by waves having the same longitudinal or transverse vibration mode through the common reference electrode (10).

2. Elementary filter according to claim 1, wherein the acoustic substrate (12, 212) is constituted by a layer of a second thickness of a second material which has a product of the operating frequency and acoustic quality factor which is at least $5 \times 10^{12}$, and which is orientated in accordance with an angle φ defined by nomenclature (YXw)/φ of the IEEE standard Std-176 (1949 revision) as being equal to zero, cut in accordance with a second cutting angle θ2 defined by nomenclature (YXl)/θ of the IEEE standard Std-176 (1949 revision) and which has at least one polarisation direction $\vec{P}_{B1}$ corresponding to at least one vibration mode and in that the relative arrangement of the piezoelectric transducer (8, 208) and the acoustic substrate (12, 212) is such that the polarisation direction of the vibration mode of the piezoelectric transducer (8, 208) and a polarisation direction of the at least one vibration mode of the acoustic substrate (12, 212) corresponding to the second cutting angle θ2 are aligned.

3. Elementary filter according to claim 2, wherein the ratio of the thickness of the acoustic substrate (12) to the thickness of the piezoelectric transducer (8) is greater than or equal to one.

4. Elementary filter according to claim 2, wherein the second material of the acoustic substrate (12, 212) is included in the group of materials constituted by quartz, potassium niobate, gallium orthophosphate ($GaPO_4$), lithium tetraborate ($LiB_4O_7$), langanite ($La_3Ga_5SO_{14}$), langatate and langanite.

5. Elementary filter according to claim 4, wherein the second material of the acoustic substrate (12, 212) is quartz.

6. Elementary filter according to claim 1, wherein the angle φ defined by nomenclature (YXw)/φ of the IEEE standard Std-176 (1949 revision) is equal to zero.

7. Elementary filter according to claim 1, wherein the angle φ defined by nomenclature (YXw)/φ of the IEEE standard Std-176 (1949 revision) is different from zero.

8. Elementary filter according to claim 1, wherein the same vibration mode of the waves is longitudinal.

9. Elementary filter according to claim 1, wherein the same vibration mode of the waves is transverse.

10. Elementary filter according to claim 1 wherein the first material of the piezoelectric transducer (8, 208) is included in the group of materials constituted by aluminium nitride (AlN), zinc oxide (ZnO), lithium niobate ($LiNbO_3$), lithium tantalate ($LiTaO_3$) and potassium niobate.

11. Elementary filter according to claim 10, wherein the first material of the piezoelectric transducer (8, 208) is included in the group of materials constituted by lithium niobate ($LiNbO_3$) and lithium tantalate ($LiTaO_3$).

12. Elementary filter according to claim 1, wherein the common reference electrode (10) is constituted by a thermocompressible metal.

13. Elementary filter according to claim 1, wherein the common reference electrode (10) is constituted by gold or copper or indium.

14. Elementary filter of the HBAR type which is intended to operate at a predetermined operating frequency, comprising:
   a first resonator (20, 220) and a second resonator (22, 222) of the HBAR type and a coupling element (28, 228) for electroacoustic coupling by means of overlapping of evanescent waves,
   the first resonator (20, 220) and the second resonator (22, 222) each comprising a first electrical excitation electrode (4) and a second electrical excitation electrode (6), respectively, the first and second electrical excitation electrodes being discrete and separated by a channel (18), a common reference electrode (10) and a common monobloc piezoelectric transducer (8, 208), the coupling element (28, 228) comprising an intermediate zone (26, 226) of the piezoelectric transducer (8, 208) that is arranged between the first resonator and the second resonator (20, 22; 220, 222), the piezoelectric transducer (8, 208) being constituted by a layer of a first thickness of a first material which is orientated in accordance with an angle φ defined by nomenclature (YXw)/φ of the IEEE standard Std-176 (1949 revision), and which is cut in accordance with a first cutting angle θ1 defined by nomenclature (YXl)/θ of the IEEE standard Std-176 (1949revision), such that the electroacoustic coupling of the waves in accordance with a longitudinal mode or a transverse mode within the first material alone is greater than 5%, wherein the first resonator (20, 220), the second resonator (22, 222) and the coupling element (28, 228) comprise a common monobloc acoustic substrate (12, 212) which is arranged facing and coupled to the piezoelectric transducer (8, 208) by waves having the same longitudinal or transverse vibration mode through the common reference electrode (10), and wherein the common reference electrode (10) is extended laterally and round the transducer (8, 208) to constitute the first and second connection elements, which each have an end at the same level as the first and second electrical excitation electrodes (4) and (6).

* * * * *